(12) United States Patent
Hsiao et al.

(10) Patent No.: US 12,308,271 B2
(45) Date of Patent: May 20, 2025

(54) SEMICONDUCTOR WAFER PROCESSING SYSTEM AND METHOD

(71) Applicant: Taiwan Semiconductor Manufacturing Company Limited, Hsin-Chu (TW)

(72) Inventors: Kai-Hung Hsiao, Kaohsiung (TW); Chi-Chung Jen, Kaohsiung (TW); Yu-Chun Shen, Tainan (TW); Jhang-Jie Jian, Tainan (TW); Wen-Chih Chiang, Hsinchu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 18/439,420

(22) Filed: Feb. 12, 2024

(65) Prior Publication Data
US 2024/0258145 A1    Aug. 1, 2024

Related U.S. Application Data

(62) Division of application No. 17/463,846, filed on Sep. 1, 2021, now Pat. No. 11,901,207.

(60) Provisional application No. 63/212,506, filed on Jun. 18, 2021.

(51) Int. Cl.
*H01L 21/677* (2006.01)
*H01L 21/673* (2006.01)
*H05F 3/00* (2006.01)
*B25J 11/00* (2006.01)

(52) U.S. Cl.
CPC .... *H01L 21/67733* (2013.01); *H01L 21/6732* (2013.01); *H05F 3/00* (2013.01); *B25J 11/0095* (2013.01)

(58) Field of Classification Search
CPC ....... H05F 3/00; H05F 3/02; H01L 21/67736; H01L 21/67769; H01L 21/67386; H01L 21/67396; H01L 21/6732; H01L 21/67733; B25J 11/0095
USPC .......................................... 361/56, 220, 234
See application file for complete search history.

(56) References Cited

U.S. PATENT DOCUMENTS

2009/0038985 A1* 2/2009 Wang ................... G03F 7/70858
206/710
2017/0005464 A1* 1/2017 Hwang .............. H01R 13/2442

* cited by examiner

*Primary Examiner* — Kevin J Comber
(74) *Attorney, Agent, or Firm* — Cooper Legal Group, LLC

(57) ABSTRACT

A semiconductor wafer processing system includes a stocker having an interior surface, a wafer carrier disposed within the stocker, a wafer shelf disposed within the wafer carrier for storing a semiconductor wafer, and a discharge circuit including a first conductor electrically coupled to the wafer shelf and a first current controller electrically coupled to the first conductor and to the interior surface of the stocker.

20 Claims, 9 Drawing Sheets

SEMICONDUCTOR WAFER PROCESSING SYSTEM AND METHOD

RELATED APPLICATION

This application is a divisional of U.S. Non-Provisional patent application Ser. No. 17/463,846 titled "SEMICONDUCTOR WAFER PROCESSING SYSTEM AND METHOD" and filed on Sep. 1, 2021, which claims priority to U.S. Provisional Patent Application 63/212,506 titled "APPARATUS AND METHOD FOR STORING A SEMICONDUCTOR WAFER" and filed on Jun. 18, 2021. U.S. Non-Provisional patent application Ser. No. 17/463,846 and U.S. Provisional Patent Application 63/212,506 are incorporated herein by reference.

BACKGROUND

During semiconductor device manufacturing a semiconductor wafer undergoes one or more fabrication processes to form one or more semiconductor devices on and/or from the semiconductor wafer. At least some of the fabrication processes are performed at different wafer workplace stations within a wafer processing system. A wafer carrier stores semiconductor wafers and is used to transport the semiconductor wafers from a wafer stocker to various wafer workplace stations. Each wafer carrier is generally capable of storing a number of semiconductor wafers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
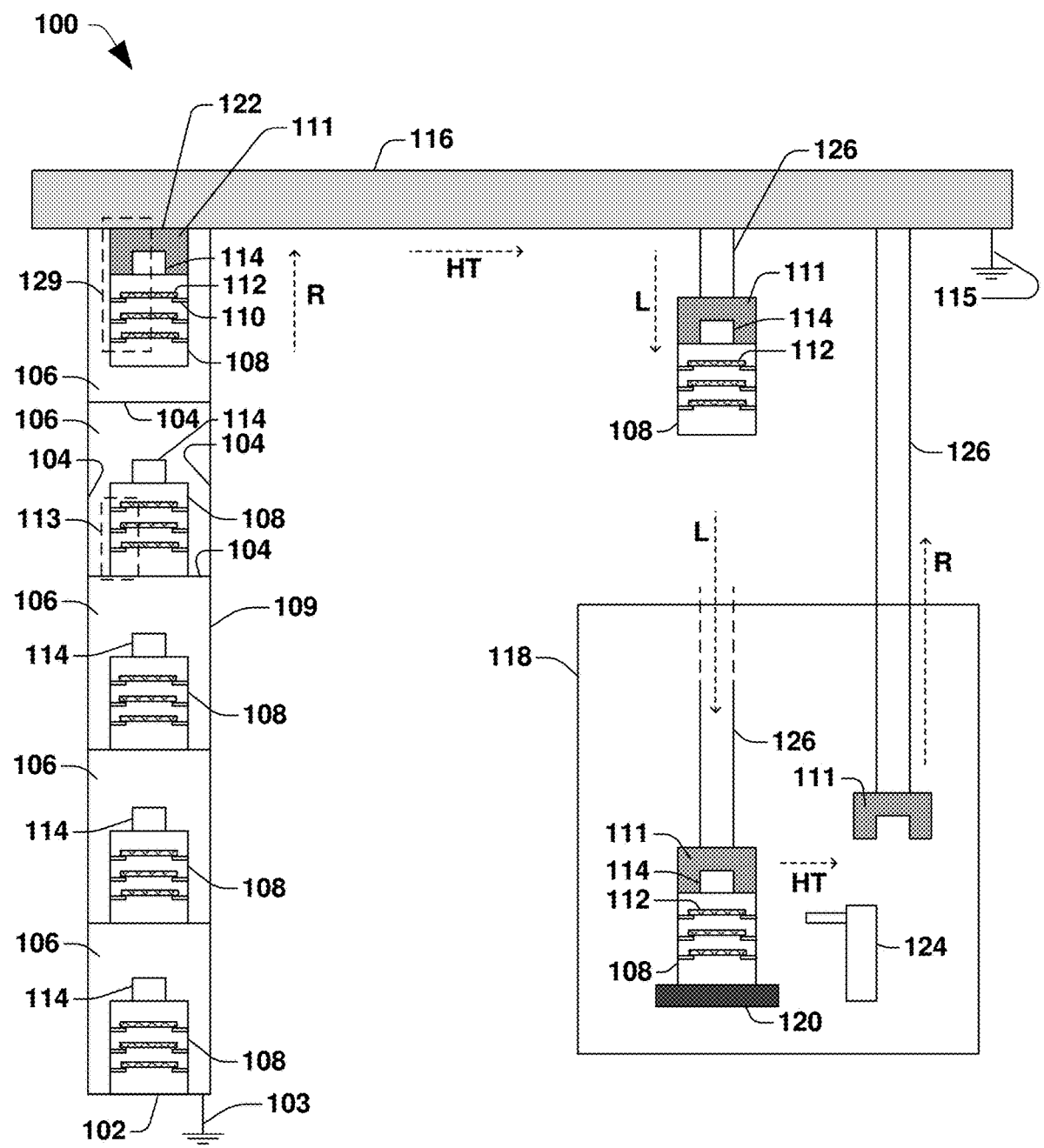
FIG. 1 is an illustration of a semiconductor wafer processing system, according to some embodiments.

The following disclosure provides several different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation illustrated in the figures. The apparatus may be otherwise oriented (rotated 90 degrees or at other orientations) and the spatially relative descriptors used herein may likewise be interpreted accordingly. Also, relationship terms such as "connected to," "adjacent to," "coupled to," and the like, may be used herein to describe both direct and indirect relationships. "Directly" connected, adjacent, or coupled may refer to a relationship in which there are no intervening components, devices, or structures. "Indirectly" connected, adjacent, or coupled may refer to a relationship in which there are intervening components, devices, or structures.

When a semiconductor wafer undergoes semiconductor processing, such as spin processing, photoresist coating, rinsing, cleaning, chemical-mechanical polishing, or other wafer processes, to form one or more semiconductor devices on and/or from the semiconductor wafer, a charge may accumulate on the wafer. The charge may cause adverse effects on the wafer during subsequent semiconductor fabrication processes performed on the wafer. The adverse effects may reduce wafer yield, cause undesired, unintended, unpredictable, etc. semiconductor device performance, increase costs, etc.

According to some embodiments, a semiconductor wafer storing apparatus comprises a wafer carrier having a wafer shelf. A wafer stocker houses the wafer carrier. A conductor overlies and/or is electrically coupled to the wafer shelf. A semiconductor wafer disposed on the wafer shelf is thereby in electrical contact with the conductor. The conductor is in electrical contact with a current controller electrically coupled to a housing of the wafer stocker. The current controller permits charge flow away from the wafer to the housing and inhibits charge flow from the housing to the wafer.

When the wafer is placed on the wafer shelf in the wafer stocker and the charge accumulated on the wafer is greater than a charge of the housing, the current controller permits charge flow from the wafer to the housing. Charge flow away from the wafer to the housing lessens the charge on the wafer. Lessening the charge on the wafer may reduce adverse effects on the wafer during subsequent semiconductor fabrication processes performed on the wafer, which can, in turn, increase wafer yield, mitigate undesired, unintended, unpredictable, etc. resulting semiconductor device performance, reduce costs, etc.

According to some embodiments, a semiconductor wafer storing apparatus comprises a wafer carrier having a wafer shelf. A wafer stocker houses the wafer carrier. A conductor overlies and/or is electrically coupled to the wafer shelf. A semiconductor wafer disposed on the wafer shelf is thereby in electrical contact with the conductor. The conductor is in electrical contact with a current controller electrically coupled to a robotic handling system. The current controller permits charge flow away from the wafer to the robotic handling system and inhibits charge flow from the robotic handling system to the wafer.

When the wafer is placed on the wafer shelf in the wafer stocker and the charge accumulated on the wafer is greater than a charge of the robotic handling system, the current controller permits charge flow from the wafer to the robotic handling system. Charge flow away from the wafer to the robotic handling system lessens the charge on the wafer. Lessening the charge on the wafer may reduce adverse effects on the wafer during subsequent semiconductor fabrication processes performed on the wafer, which can, in turn, increase wafer yield, mitigate undesired, unintended, unpredictable, etc. resulting semiconductor device performance, reduce costs, etc.

FIG. 1 is an illustration of a semiconductor wafer processing system 100, according to some embodiments. The semiconductor wafer processing system 100 comprises a wafer stocker 102 and wafer carriers 108. The wafer stocker 102 comprises interior surfaces 104 defining stocker compartments 106. In some embodiments, a semiconductor wafer storing apparatus 109 comprises the wafer stocker 102, the wafer carriers 108, and a wafer carrier transport tool 111, such as a gripper transport tool. The wafer carrier transport tool 111 loads wafer carriers 108 into the stocker compartments 106 and unloads wafer carriers 108 from the stocker compartments 106. Other configurations of the semiconductor wafer storing apparatus 109 are within the scope of the present disclosure.

According to some embodiments, the wafer carriers 108 comprise wafer shelves 110 to support semiconductor wafers 112. The wafer carriers 108 store the semiconductor wafers 112, and the wafer stocker 102 stores the wafer carriers 108. The wafer carriers 108 store the semiconductor wafers 112 during transportation to locations outside of the wafer stocker 102.

According to some embodiments, the semiconductor wafer processing system 100 comprises a first discharge circuit 113. The first discharge circuit 113 comprises a conductor (not shown) overlying and/or electrically coupled to a wafer shelf of the wafer shelves 110. The first discharge circuit 113 may be electrically coupled to the wafer stocker 102. The conductor of the first discharge circuit 113 provides a conductive path to conduct charge(s) on one or more of the semiconductor wafers 112 to the wafer stocker 102, thereby discharging the charge(s) on one or more of the semiconductor wafers 112. According to some embodiments, the wafer stocker 102 is electrically coupled to a first grounded conductor 103. Other configurations of the first discharge circuit 113 are within the scope of the present disclosure.

A wafer carrier of the wafer carriers 108 may be a Front Opening Unified Pod (FOUP), a Front Opening Shipping Box (FOSB), or other suitable devices for storing wafers inside the wafer stocker 102 and/or outside of the wafer stocker 102. According to some embodiments, a wafer carrier of the wafer carriers 108 comprises a wafer carrier handle 114. Other configurations of the wafer carriers 108 are within the scope of the present disclosure.

A semiconductor wafer fabrication plant ("fab") comprises semiconductor wafer processing systems, such as the semiconductor wafer processing system 100. The semiconductor wafer processing system 100 may comprise a robotic handling system 116 for transporting the wafer carriers 108 to locations within the semiconductor wafer processing system 100 and/or to other locations within the fab. The wafer carrier transport tool 111 may be part of the robotic handling system 116. The robotic handling system 116 may comprise an automated material handling system (AMHS) and/or other suitable wafer carrier transportation device(s).

The semiconductor wafer processing system 100 comprises a wafer workplace station 118. Wafer workplace stations generally comprise one or more tools to perform one or more semiconductor fabrication processes, such as etching, deposition, etc., on one or more semiconductor wafers. Movement of semiconductor wafers 112 into and out of the wafer workplace station 118 may be accomplished by the robotic handling system 116. The wafer carriers 108 containing the semiconductor wafers 112 may be transported by the robotic handling system 116 from the wafer stocker 102 to the wafer workplace station 118 and/or to other locations within a fab. For example, the robotic handling system 116 may transport a wafer carrier of the wafer carriers 108 from the wafer stocker 102 to a load port 120 of the wafer workplace station 118, from the load port 120 of the wafer workplace station 118 to a load port of another wafer workplace station (not shown), and from the load port of the other wafer workplace station to a wafer carrier unloading port (not shown). Other configurations of devices to transport the wafer carriers 108 to locations within the semiconductor wafer processing system 100 and/or to other locations within a fab are within the scope of the present disclosure.

According to some embodiments, an interior of a wafer carrier of the wafer carriers 108 comprises a controlled environment in which the semiconductor wafers 112 are held. The wafer shelves 110 within the wafer carriers 108 support the semiconductor wafers 112 within the controlled environment. According to some embodiments, a front opening door of a wafer carrier of the wafer carriers 108 allows a wafer access device 124 to access and remove a semiconductor wafer from the controlled environment of the wafer carrier when the wafer carrier is on the load port 120. The removed wafer may be processed by the wafer workplace station 118. A processed wafer may be returned to the wafer carrier by the wafer access device 124 and/or other suitable wafer handling device.

According to some embodiments, at least portions of the robotic handling system 116 are situated over the load port 120. The wafer carriers 108 are placed onto and removed from the load port 120 by the robotic handling system 116. In some embodiments, the robotic handling system 116 transports the wafer carriers 108 relatively long distances between different wafer workplace stations 118. Wafer workplace stations 118 may be located at different areas of the same fab/building, or at areas in different fabs/buildings. Each wafer workplace station of the wafer workplace stations 118 may perform one or more semiconductor wafer fabrication processes on the semiconductor wafers 112.

According to some embodiments, wafer workplace stations 118 are each associated with a corresponding wafer stocker. For example, according to some embodiments a first wafer workplace station may be associated with a first stocker such that wafers are transported from the first stocker to the first wafer workplace station. A second wafer workplace station may be associated with a second stocker such that wafers are transported from the second stocker to the second wafer workplace station. According to some embodiments, a wafer workplace station may be associated with a first stocker and a second stocker such that semiconductor wafers are transported between the first stocker and the wafer workplace station and between the second stocker and the wafer workplace station. According to some embodiments, a stocker may be associated with a first wafer workplace station and a second wafer workplace station such that wafers are transported between the stocker and the first wafer workplace station and between the stocker and the second wafer workplace station. Other arrangements and associations of stocker(s) and wafer workplace station(s) are within the scope of the present disclosure.

According to some embodiments, the wafer carriers 108 store wafer lots waiting to be processed by the wafer workplace station 118. For example, the robotic handling system 116 may comprise a load port 122 for loading wafer carriers 108 from the wafer stocker 102 to the robotic handling system 116. The wafer carriers 108 may be transferred by the wafer carrier transport tool 111 of the robotic handling system 116. The wafer carriers 108 may be transferred in a sequential order according to lot orders communicated from a real time dispatching system (not shown). Lots not queued for processing within a corresponding tool may remain within the wafer stocker 102. In some embodiments, a processed lot of semiconductor wafers 112 on the load port 120 is removed from the load port 120 and transported by the wafer carrier transport tool 111 to a stocker associated with a subsequent destination and/or wafer workplace station.

According to some embodiments, the semiconductor wafer processing system 100 may comprise a second discharge circuit 129. The second discharge circuit 129 comprises a conductor (not shown) overlying and/or electrically coupled to a wafer shelf of the wafer shelves 110 and electrically coupled to the robotic handling system 116. The conductor of the second discharge circuit 129 provides a conductive path to conduct charge(s) on one or more of the semiconductor wafers 112 to the robotic handling system 116, thereby discharging the charge(s) on one or more of the semiconductor wafers 112. According to some embodiments, the robotic handling system 116 is electrically coupled to a second grounded conductor 115. Other configurations of the second discharge circuit 129 are within the scope of the present disclosure.

According to some embodiments, the wafer carrier transport tool 111 may be raised R, horizontally transferred HT and lowered L by guiding rods 126. The wafer carrier transport tool 111 may thus grip a wafer carrier handle 114 of a wafer carrier to facilitate the wafer carrier being picked up, transported, and/or placed at various locations, such as different wafer workplace stations, within a fab utilizing the guiding rods 126.

Figure 2:
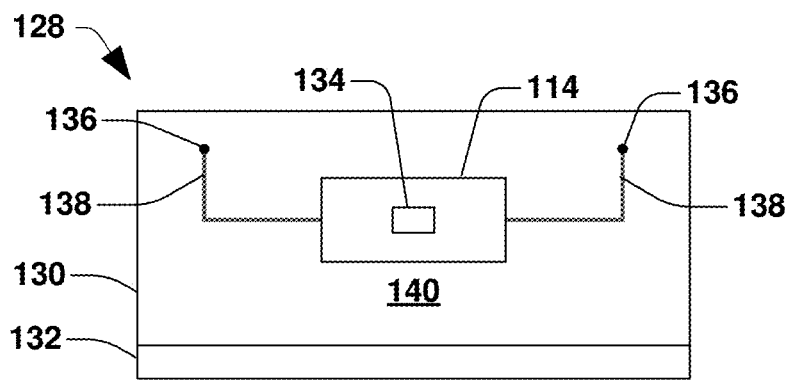
FIG. 2 is a top view of a wafer carrier, according to some embodiments.

FIG. 2 is a top view of a wafer carrier 128 of the wafer carriers 108, according to some embodiments. The wafer carrier 128 comprises a housing 130 having a wafer access door 132 and the wafer carrier handle 114. The wafer access door 132 may be opened and closed to allow one or more semiconductor wafers to be placed into and/or taken out of the wafer carrier 128. A first current controller 134 overlies and/or is electrically coupled to the wafer carrier handle 114.

According to some embodiments, the first current controller 134 is a diode, a poly fuse, a sensor, and/or other device that permits charge flow in a first direction and inhibits charge flow in a second direction, opposite the first direction. The first current controller 134 may permit charge flow away from semiconductor wafers and inhibit charge flow to semiconductor wafers.

The wafer carrier 128 comprises one or more first conductive contacts 136 disposed on an upper surface 140 of the housing 130. The first conductive contacts 136 are electrically coupled to a first conductor 138. According to some embodiments, the first direction of charge flow is from the first conductive contacts 136 to the first current controller 134. For example, in embodiments in which the first current controller 134 is a diode, the first conductive contacts 136 are electrically coupled via the first conductor 138 to the anode of the diode.

Figure 3:
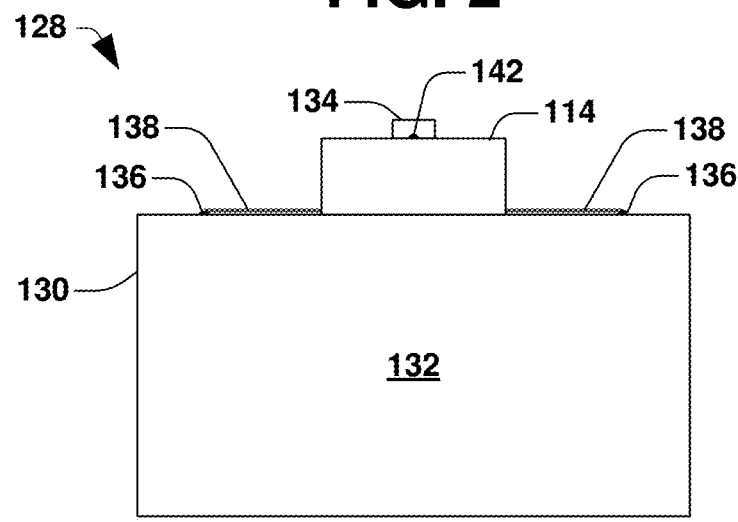
FIG. 3 is a front view of a wafer carrier, according to some embodiments.
Figure 4:
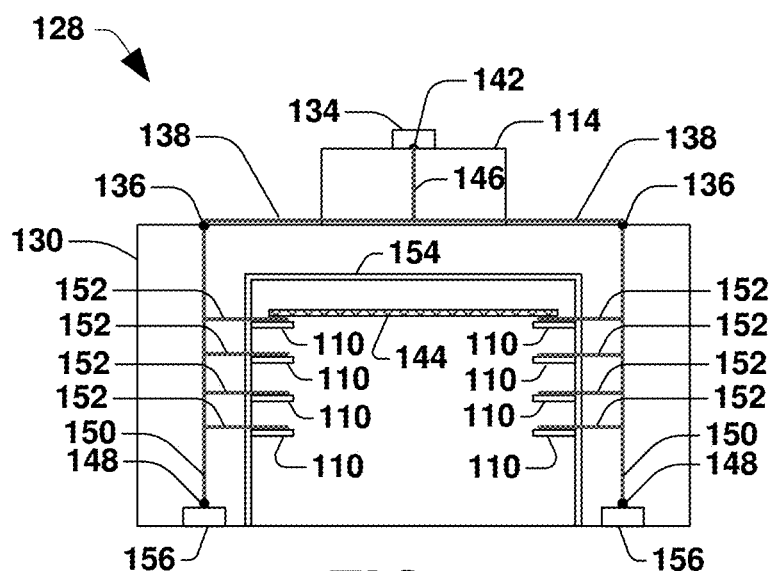
FIG. 4 is a front cross-sectional view of a wafer carrier, according to some embodiments.

FIG. 3 is a front view of the wafer carrier 128 and illustrates the housing 130, the wafer carrier handle 114, the wafer access door 132, the first current controller 134, the first conductive contacts 136, and the first conductor 138. The wafer carrier 128 comprises a second conductive contact 142. As illustrated in FIG. 4, the second conductive contact 142 is electrically coupled to the first conductor 138.

FIG. 4 is a front cross-sectional view of the wafer carrier 128 and includes a depiction of a semiconductor wafer 144 of the semiconductor wafers 112. The wafer carrier 128 comprises a second conductor 146 electrically coupled to the first conductor 138 and to the second conductive contact 142. The wafer carrier 128 comprises third conductive contacts 148 and third conductors 150. According to some embodiments, the third conductors 150 are electrically coupled to the first conductive contacts 136 and to the third conductive contacts 148. The wafer carrier 128 comprises fourth conductors 152 electrically coupled to the third conductors 150 and overlying and/or electrically coupled to the wafer shelves 110. According to some embodiments, the wafer carrier 128 comprises a frame 154 coupled to and physically supporting the wafer shelves 110.

Semiconductor wafers, such as the semiconductor wafer 144, may overlie and/or be electrically coupled to the fourth conductors 152 and/or the wafer shelves 110. Second current controllers 156 are electrically coupled to the third conductive contacts 148. According to some embodiments, the second current controllers 156 comprise a diode, a poly fuse, a sensor, and/or other devices that permit charge flow in a first direction and inhibit charge flow in a second direction, opposite the first direction. For example, in embodiments in which the second current controllers 156 comprise a diode, the third conductive contacts 148 are electrically coupled to the anode of the diode.

Figure 5:
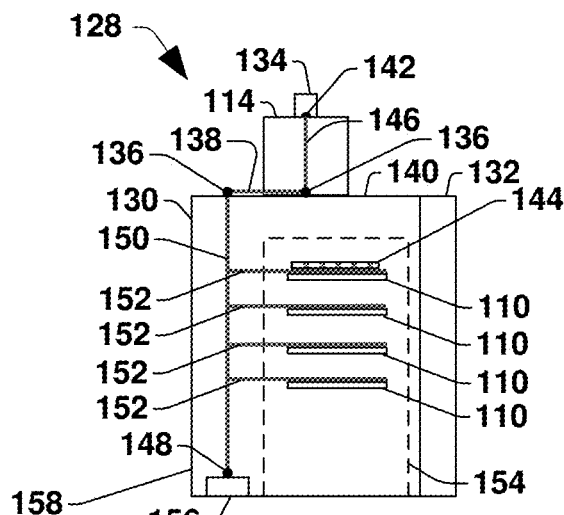
FIG. 5 is a side cross-sectional view of a wafer carrier, according to some embodiments.

FIG. 5 is a side cross-sectional view of the wafer carrier 128, according to some embodiments. The wafer carrier 128 comprises one or more of the components depicted in one or more of FIG. 2 to FIG. 4. According to some embodiments, the second current controllers 156 are disposed proximate a rear wall 158 of the housing 130. The rear wall 158 may be disposed opposite the wafer access door 132.

Figure 6:
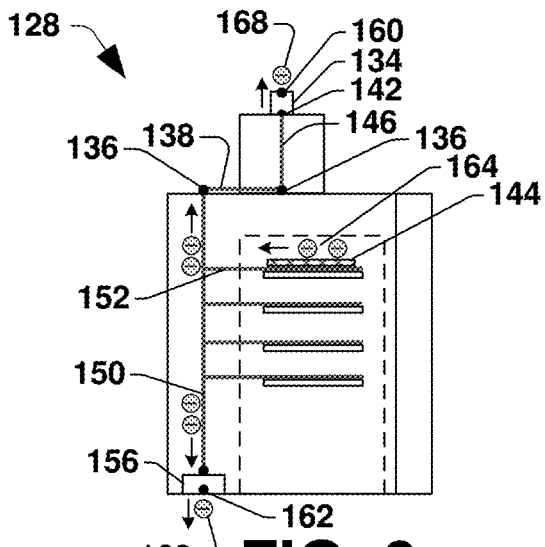
FIG. 6 is a side cross-sectional view of a wafer carrier, according to some embodiments.

FIG. 6 is a side cross-sectional view of the wafer carrier 128, according to some embodiments. The wafer carrier 128 comprises one or more of the components depicted in one or more of FIG. 2 to FIG. 5. For simplicity and clarity of presentation, reference numerals of several components illustrated in FIG. 6 and having the same reference numerals as components in one or more of FIG. 2 to FIG. 5 are not shown.

The wafer carrier 128 comprises a fourth conductive contact 160 electrically coupled to the first current controller 134 and a fifth conductive contact 162 electrically coupled to one of the second current controllers 156. According to some embodiments, a first charge 164 on a surface of the semiconductor wafer 144 is greater than a second charge 166 at the fifth conductive contact 162 and/or greater than a third charge 168 at the fourth conductive contact 160. Accordingly, the first charge 164 on the surface of the semiconductor wafer 144 will dissipate to at least one of the fourth conductive contact 160 or the fifth conductive contact 162 in the direction depicted by the arrows in FIG. 6. The first charge 164 on the surface of the semiconductor wafer 144 will carry through a conductor of the fourth conductors 152 to a conductor of the third conductors 150. The first charge 164 may carry through the first conductor 138 to the second conductor 146, through the second conductor 146 to the first current controller 134, and to the fourth conductive contact 160. The first charge 164 may carry through a current controller of the second current controllers 156 and to the fifth conductive contact 162. Thus, according to some embodiments the wafer carrier 128 is configured to lessen a charge on the semiconductor wafer 144 through discharge of the charge to the fourth conductive contact 160 and/or to the fifth conductive contact 162.

Figure 7:
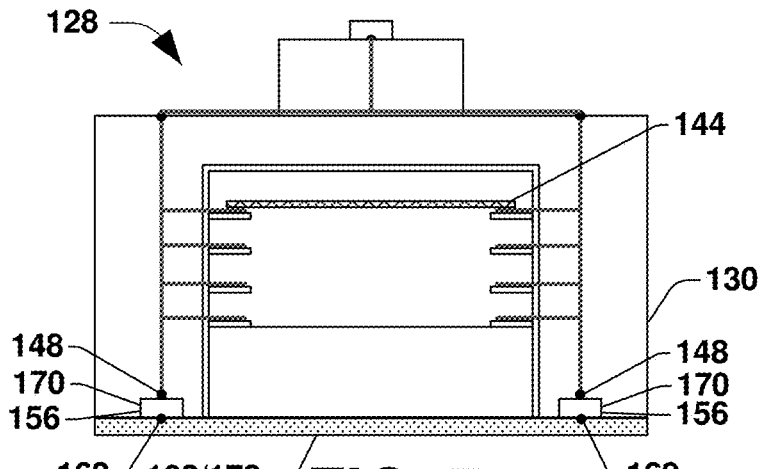
FIG. 7 is a front cross-sectional view of a wafer carrier, according to some embodiments.

FIG. 7 is a front cross-sectional view of the wafer carrier 128, according to some embodiments. For simplicity and clarity of presentation, reference numerals of several components illustrated in FIG. 7 and having the same reference numerals as components in one or more of FIG. 2 to FIG. 6 are not shown. The second current controllers 156 may comprise sensor-controlled circuit modules 170 electrically coupled to the third conductive contacts 148 and to the fifth conductive contacts 162. The sensor-controlled circuit modules 170 detect a first charge at a contact of the third conductive contacts 148 and a second charge at a contact of the fifth conductive contacts 162. In some embodiments, the sensor-controlled circuit modules 170 compare the first charge to the second charge.

If the first charge is greater than the second charge, the sensor-controlled circuit modules 170 close conductive paths from the third conductive contacts 148 to the fifth conductive contacts 162 to allow charge flow from the third conductive contacts 148 to the fifth conductive contacts 162. Allowing charge flow from the third conductive contacts 148 to the fifth conductive contacts 162 lessens a charge on the semiconductor wafer 144.

If the first charge is less than the second charge, the sensor-controlled circuit modules 170 cause the conductive paths from the third conductive contacts 148 to the fifth conductive contacts 162 to open to inhibit charge flow from the fifth conductive contacts 162 to the third conductive contacts 148. Inhibiting charge flow from the fifth conductive contacts 162 to the third conductive contacts 148 inhibits charge flow back to the semiconductor wafer 144.

According to some embodiments, the wafer stocker 102 comprises a wireless charging plate 172. The wireless charging plate 172 may be activated when in contact with the wafer carrier 128 to wirelessly charge the sensor-controlled circuit modules 170. Other devices may be configured to charge the sensor-controlled circuit modules 170 and are within the scope of the present disclosure.

Figure 8:
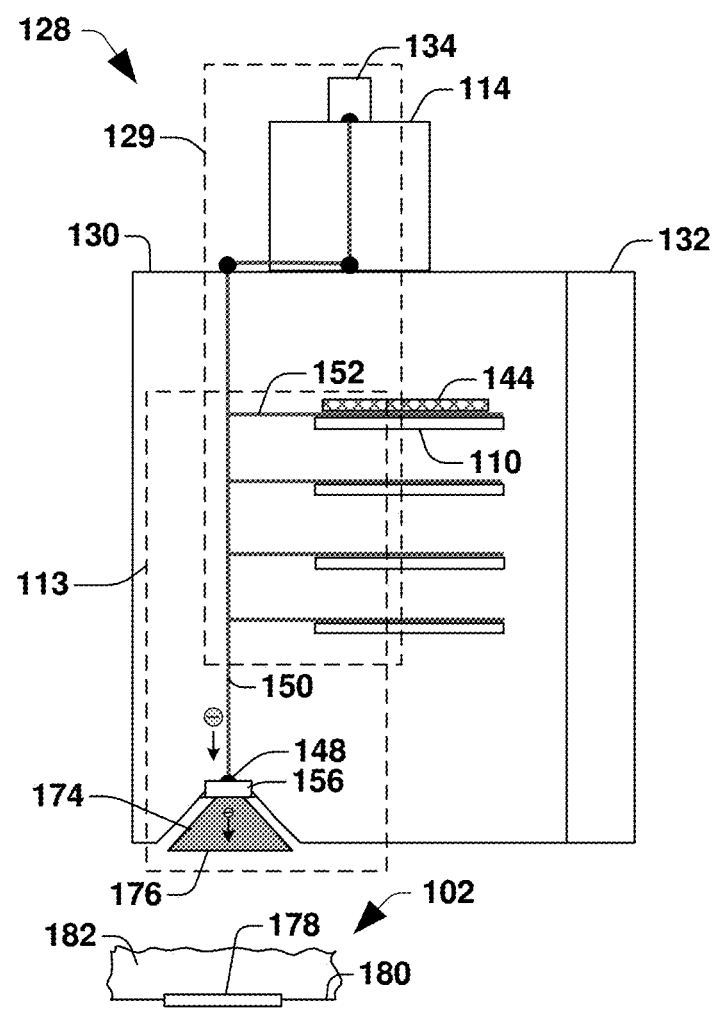
FIG. 8 is a side cross-sectional view of a wafer carrier, according to some embodiments.

FIG. 8 is a side cross-sectional view of the wafer carrier 128, according to some embodiments. For simplicity and clarity of presentation, reference numerals of several components illustrated in FIG. 8 and having the same reference numerals as components in one or more of FIG. 2 to FIG. 7 are not shown. The wafer carrier 128 comprises the first discharge circuit 113 and/or the second discharge circuit 129.

According to some embodiments, the first discharge circuit 113 comprises a stocker contact 174 electrically coupled to a current controller of the second current controllers 156. The stocker contact 174 is conductive and comprises a conductive surface 176. The conductive surface 176 contacts a conductor 178 at a bottom surface 180 of a compartment 182 of the stocker compartments 106 when the wafer carrier 128 is situated on the bottom surface 180 of the compartment 182. The second current controller 156 permits charge flow from the third conductive contact 148 to the conductor 178 when the wafer carrier 128 is situated on the bottom surface 180 of the compartment 182. The second current controller 156 inhibits charge flow from the conductor 178 to the third conductive contact 148 when the wafer carrier 128 is situated on the bottom surface 180 of the compartment 182. For example, in some embodiments the second current controller 156 is a diode comprising an anode coupled to the third conductive contact 148 and a cathode coupled to the stocker contact 174. Other configurations of the first discharge circuit 113 are within the scope of the present disclosure.

Figure 9:
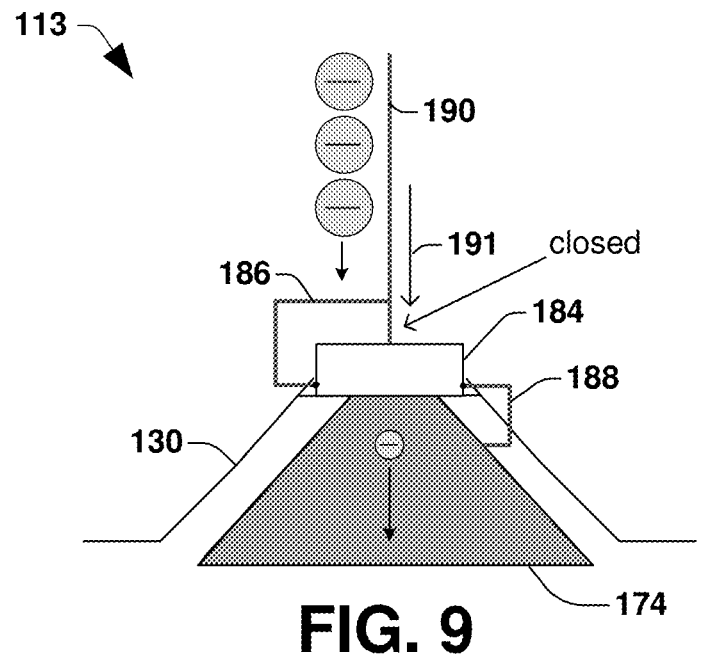
FIG. 9 is an illustration of a discharge circuit, according to some embodiments.
Figure 10:
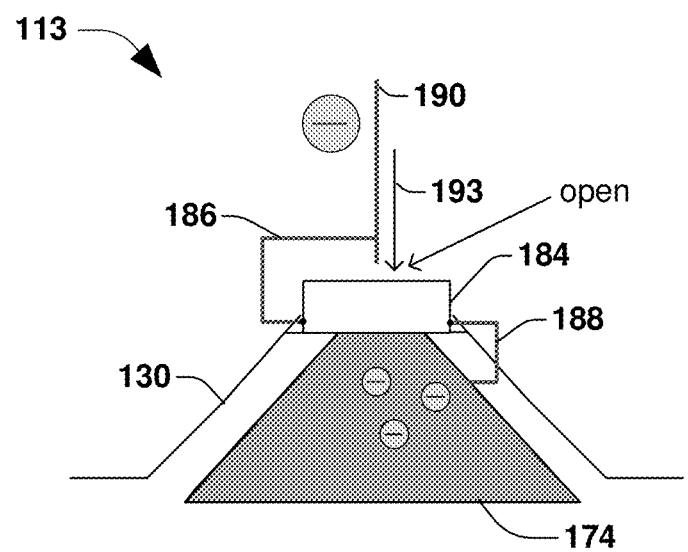
FIG. 10 is an illustration of a discharge circuit, according to some embodiments.

FIG. 9 is an illustration of the first discharge circuit 113 comprising a sensor-controlled circuit module 184 in a closed state. FIG. 10 is an illustration of the first discharge circuit 113 comprising the sensor-controlled circuit module 184 in an open state.

Referring to FIG. 9, when the sensor-controlled circuit module 184 detects via a fifth conductor 186 and a sixth conductor 188 that a charge at a conductor 190 of the third conductors 150 (and hence a charge at the fourth conductors (152)) is greater than a charge at the stocker contact 174, the sensor-controlled circuit module 184 closes a conductive path 191 from the conductor 190 to the stocker contact 174. Closing the conductive path 191 permits charge flow from the conductor 190 to the stocker contact 174, thus allowing charge to dissipate from a semiconductor wafer.

Referring to FIG. 10, when the sensor-controlled circuit module 184 detects via the fifth conductor 186 and the sixth conductor 188 that a charge at a conductor 190 of the third conductors 150 (and hence a charge at the fourth conductors (152)) is less than a charge at the stocker contact 174, the sensor-controlled circuit module 184 opens a conductive path 193 from the conductor 190 to the stocker contact 174. Opening the conductive path 193 inhibits charge flow from the stocker contact 174 to the conductor 190, thus inhibiting charge from flowing back to a semiconductor wafer.

Figure 11:
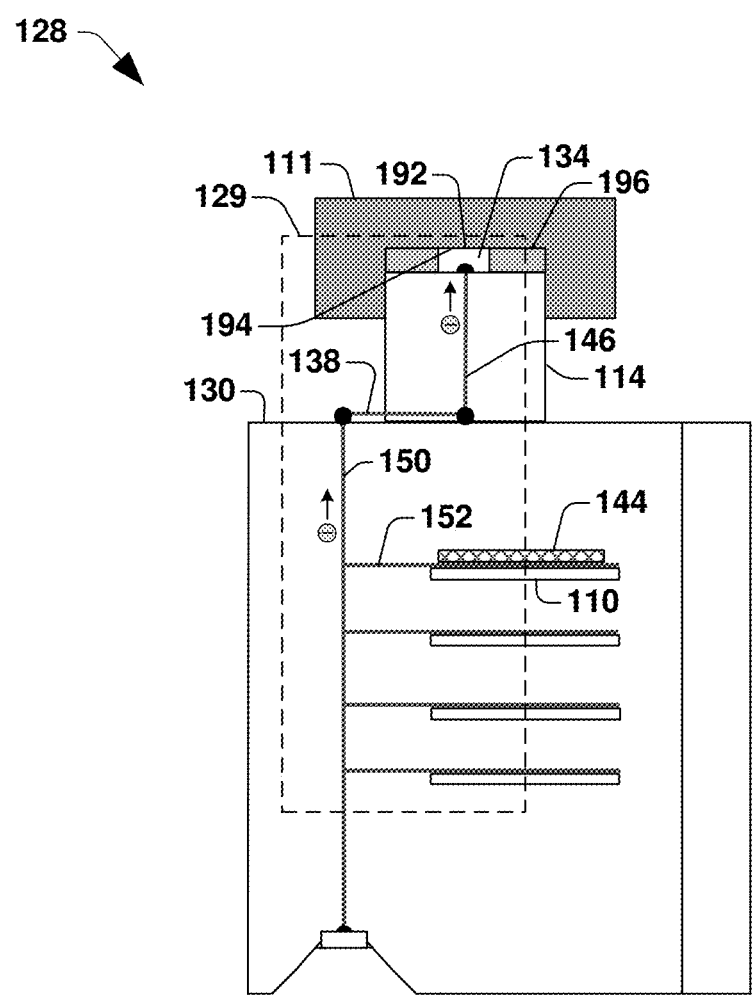
FIG. 11 is a side cross-sectional view of a wafer carrier, according to some embodiments.

FIG. 11 is a side cross-sectional view of the wafer carrier 128, according to some embodiments. For simplicity and clarity of presentation, reference numerals of several components illustrated in FIG. 11 and having the same reference numerals as components in one or more of FIG. 2 to FIG. 10 are not shown.

According to some embodiments, the second discharge circuit 129 comprises the first current controller 134. The first current controller 134 is conductive and comprises a conductive surface 192. In some embodiments, the second discharge circuit 129 comprises an electrical insulation material 196 to house conductors that contact the first current controller 134.

The conductive surface 192 contacts a conductive surface 194 of the wafer carrier transport tool 111 when the wafer carrier transport tool 111 grips the wafer carrier handle 114. The first current controller 134 permits charge flow from the second conductor 146 to the wafer carrier transport tool 111 when the wafer carrier transport tool 111 grips the wafer carrier handle 114. The first current controller 134 inhibits charge flow from the wafer carrier transport tool 111 to the second conductor 146 when the wafer carrier transport tool 111 grips the wafer carrier handle 114. For example, in some embodiments the first current controller 134 is a diode comprising an anode coupled to the second conductor 146 and a cathode coupled to the conductive surface 194. Other configurations of the second discharge circuit 129 are within the scope of the present disclosure.

Figure 12:
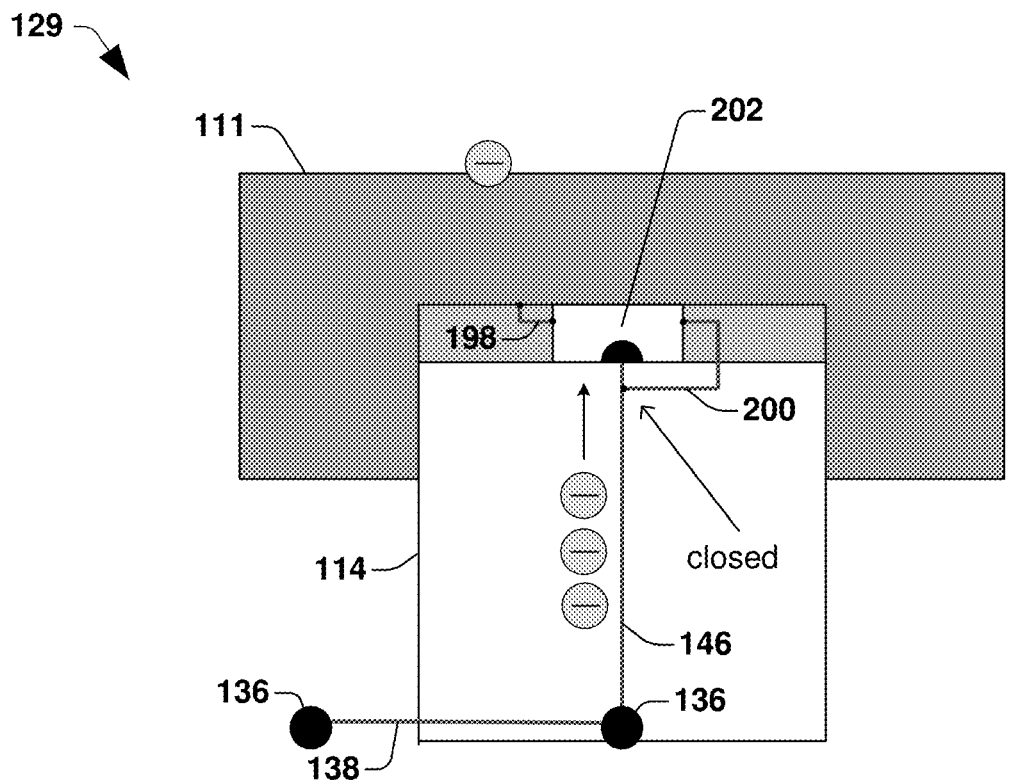
FIG. 12 is an illustration of a discharge circuit, according to some embodiments.
Figure 13:
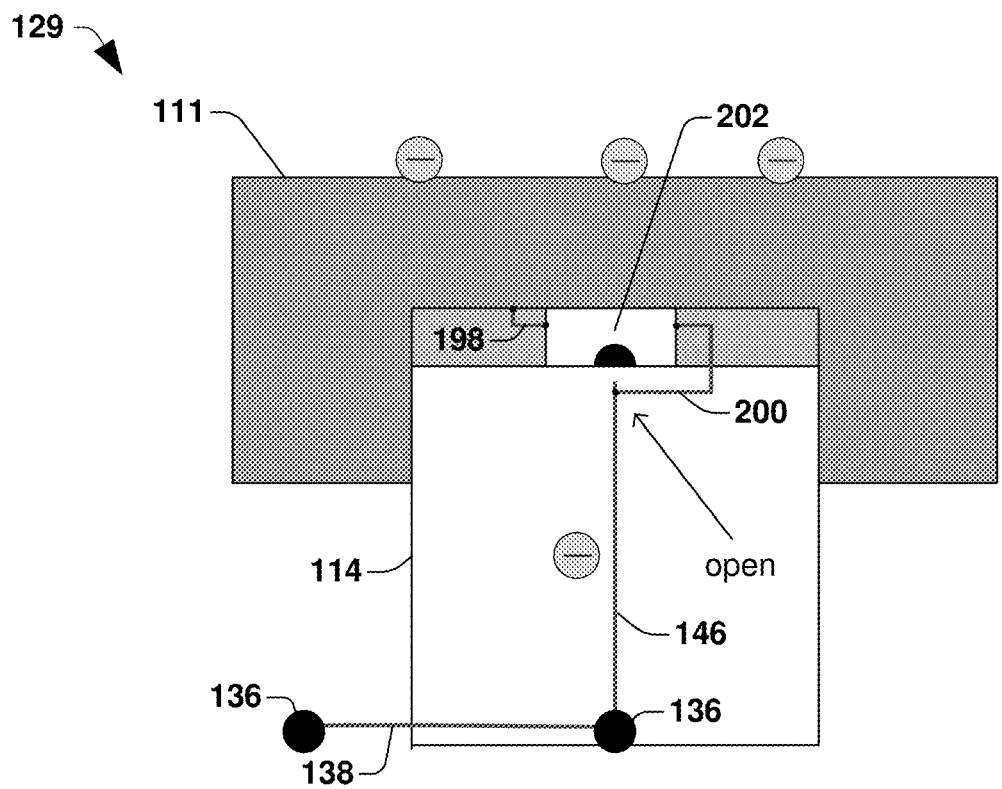
FIG. 13 is an illustration of a discharge circuit, according to some embodiments.

FIG. 12 is an illustration of the second discharge circuit 129 comprising a sensor-controlled circuit module 202 in a closed state. FIG. 13 is an illustration of the second discharge circuit 129 comprising the sensor-controlled circuit module 202 in an open state.

Referring to FIG. 12, when the sensor-controlled circuit module 202 detects via a seventh conductor 198 and an eighth conductor 200 that a charge at the wafer carrier transport tool 111 is less than a charge at the second conductor 146, the sensor-controlled circuit module 202 closes a conductive path from the second conductor 146 to the wafer carrier transport tool 111. Closing the conductive path permits charge flow from the second conductor 146 to the wafer carrier transport tool 111, thus allowing charge to dissipate from a semiconductor wafer.

Referring to FIG. 13, when the sensor-controlled circuit module 202 detects via the seventh conductor 198 and the eighth conductor 200 that a charge at the wafer carrier transport tool 111 is greater than a charge at the second conductor 146, the sensor-controlled circuit module 202 opens the conductive path from the second conductor 146 to the wafer carrier transport tool 111. Opening the conductive path inhibits charge flow from the wafer carrier transport tool 111 to the second conductor 146, thus inhibiting charge from flowing back to a semiconductor wafer.

Figure 14:
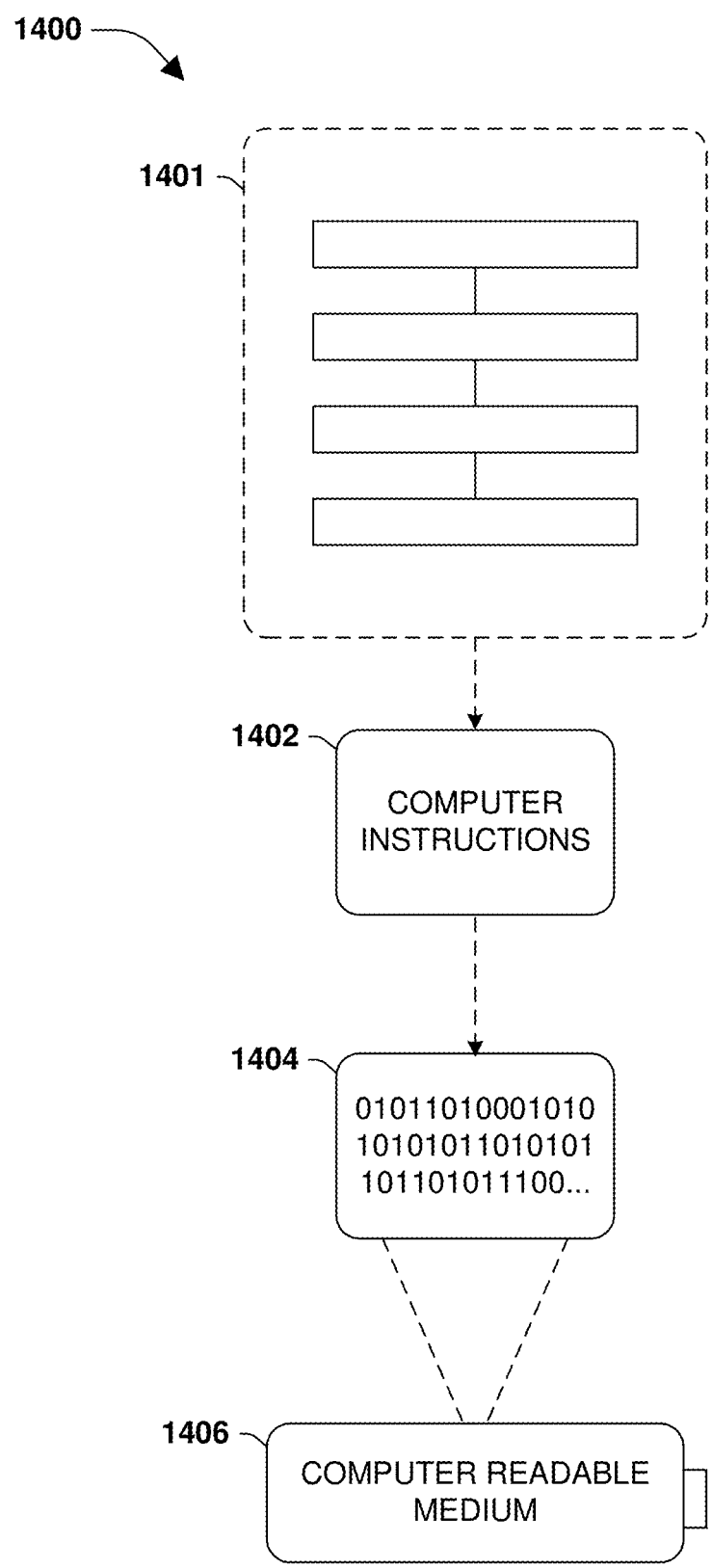
FIG. 14 is an illustration of an exemplary computer-readable medium, according to some embodiments.

FIG. 14 illustrates an exemplary computer-readable medium, according to some embodiments. One or more embodiments involve a computer-readable medium comprising processor-executable instructions configured to implement one or more of the techniques presented herein. An exemplary computer-readable medium is illustrated in FIG. 14, wherein the embodiment 1400 comprises a computer-readable medium 1406 (e.g., a CD-R, DVD-R, flash drive, a platter of a hard disk drive, etc.), on which is encoded computer-readable data 1404. This computer-readable data 1404 in turn comprises a set of processor-executable computer instructions 1402 that when executed are configured to facilitate operations according to one or more of the principles set forth herein, such as transport operations of the robotic handling system 116. In some embodiments 1400, the processor-executable computer instructions 1402 are configured to facilitate performance of a method 1401, such as at least some of the aforementioned method(s). In some embodiments, the processor-executable computer instructions 1402 are configured to facilitate implementation of a system, such as at least some of the one or more aforementioned system(s). Many such computer-readable media may be devised by those of ordinary skill in the art that are configured to operate in accordance with the techniques presented herein.

Figure 15:
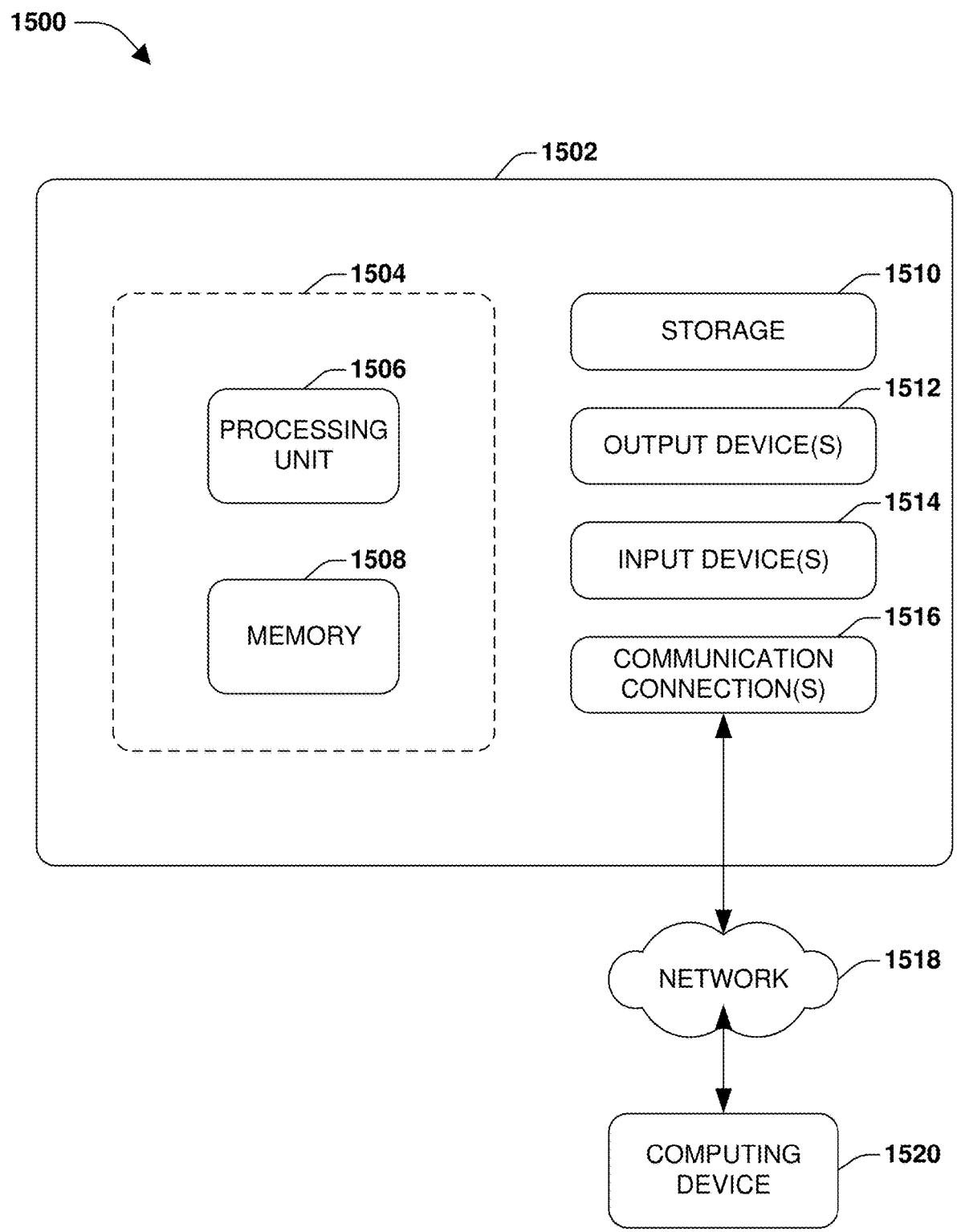
FIG. 15 illustrates an example computing environment wherein one or more of the provisions set forth herein may be implemented, according to some embodiments.

FIG. 15 illustrates an example computing environment wherein one or more of the provisions set forth herein may be implemented, according to some embodiments. FIG. 15 and the following discussion provide a brief, general description of a suitable computing environment to implement embodiments of one or more of the provisions set forth herein. The computing environment of FIG. 15 is only one example of a suitable computing environment and is not intended to suggest any limitation as to the scope of use or functionality of the computing environment. Example computing devices include, but are not limited to, personal computers, server computers, hand-held or laptop devices, mobile devices (such as mobile phones, Personal Digital Assistants (PDAs), media players, and the like), multiprocessor systems, consumer electronics, mini computers, mainframe computers, distributed computing environments that include any of the above systems or devices, and the like.

Although not required, embodiments are described in the general context of "computer readable instructions" being executed by one or more computing devices. Computer readable instructions may be distributed via computer readable media (discussed below). Computer readable instructions may be implemented as program modules, such as functions, objects, Application Programming Interfaces (APIs), data structures, and the like, that perform particular tasks or implement particular abstract data types. Typically, the functionality of the computer readable instructions may be combined or distributed as desired in various environments.

FIG. 15 depicts an example of a system 1500 comprising a computing device 1502 configured as a controller to implement embodiments provided herein. In some configurations, computing device 1502 includes at least one processing unit 1506 and memory 1508. Depending on the exact configuration and type of computing device, memory 1508 may be volatile (such as RAM, for example), non-volatile (such as ROM, flash memory, etc., for example) or some combination of the two. This configuration is illustrated in FIG. 15 by dashed line 1504.

In some embodiments, computing device 1502 may include additional features and/or functionality. For example, computing device 1502 may also include additional storage (e.g., removable and/or non-removable) including, but not limited to, magnetic storage, optical storage, and the like. Such additional storage is illustrated in FIG. 15 by storage 1510. In some embodiments, computer readable instructions to implement one or more embodiments provided herein may be in storage 1510. Storage 1510 may also store other computer readable instructions to implement an operating system, an application program, and the like. Computer readable instructions may be loaded in memory 1508 for execution by processing unit 1506, for example.

The term "computer readable media" as used herein includes computer storage media. Computer storage media includes volatile and nonvolatile, removable and non-removable media implemented in any method or technology for storage of information such as computer readable instructions or other data. Memory 1508 and storage 1510 are examples of computer storage media.

Computer storage media includes, but is not limited to, RAM, ROM, EEPROM, flash memory or other memory technology, CD-ROM, Digital Versatile Disks (DVDs) or other optical storage, magnetic cassettes, magnetic tape, magnetic disk storage or other magnetic storage devices, or any other medium which can be used to store the desired information and which can be accessed by computing device 1502. Any such computer storage media may be part of computing device 1502.

Computing device 1502 may also include communication connection(s) 1516 that allows computing device 1502 to communicate with other devices. Communication connection(s) 1516 may include, but is not limited to, a modem, a Network Interface Card (NIC), an integrated network interface, a radio frequency transmitter/receiver, an infrared port, a USB connection, or other interfaces for connecting computing device 1502 to other computing devices. Communication connection(s) 1516 may include a wired connection or a wireless connection. Communication connection(s) 1516 may transmit and/or receive communication media.

The term "computer readable media" may include communication media. Communication media typically embodies computer readable instructions or other data in a "modulated data signal" such as a carrier wave or other transport mechanism and includes any information delivery media. The term "modulated data signal" may include a signal that has one or more of its characteristics set or changed in such a manner as to encode information in the signal.

Computing device 1502 may include input device(s) 1514 such as keyboard, mouse, pen, voice input device, touch input device, infrared cameras, video input devices, and/or any other input device. Output device(s) 1512 such as one or more displays, speakers, printers, and/or any other output device may also be included in computing device 1502. Input device(s) 1514 and output device(s) 1512 may be connected to computing device 1502 via a wired connection, wireless connection, or any combination thereof. In some embodiments, an input device or an output device from another computing device may be used as input device(s) 1514 or output device(s) 1512 for computing device 1502.

Components of computing device 1502 may be connected by various interconnects, such as a bus. Such interconnects may include a Peripheral Component Interconnect (PCI), such as PCI Express, a Universal Serial Bus (USB), firewire (IEEE 1394), an optical bus structure, and the like. In some embodiments, components of computing device 1502 may be interconnected by a network. For example, memory 1508 may be comprised of multiple physical memory units located in different physical locations interconnected by a network.

Those skilled in the art will realize that storage devices utilized to store computer readable instructions may be distributed across a network. For example, a computing device 1520 accessible via a network 1518 may store computer readable instructions to implement one or more embodiments provided herein. Computing device 1502 may access computing device 1520 and download a part or all of the computer readable instructions for execution. Alternatively, computing device 1502 may download pieces of the computer readable instructions, as needed, or some instructions may be executed at computing device 1502 and some at computing device 1520.

The semiconductor wafer processing system 100 comprises the semiconductor wafer storing apparatus 109. The semiconductor wafer storing apparatus 109 comprises the fourth conductors 152 overlying and/or electrically coupled to the wafer shelves 110. The fourth conductors 152 are in electrical contact with the first current controller 134 and/or a current controller of the second current controllers 156. The first current controller 134 is in electrical contact with the wafer carrier transport tool 111. The second current controller is in electrical contact with the wafer stocker 102.

When a semiconductor wafer of the semiconductor wafers 112 is placed on a wafer shelf 110 in the wafer stocker 102 and a charge accumulated on the semiconductor wafer is greater than a charge of the wafer carrier transport tool 111 the first current controller 134 permits charge flow from the semiconductor wafer to the wafer carrier transport tool 111. Charge dissipated from the semiconductor wafer may reduce adverse effects on the wafer during subsequent semiconductor fabrication processes performed on the wafer.

When a semiconductor wafer of the semiconductor wafers 112 is placed on a wafer shelf 110 in the wafer stocker 102 and a charge accumulated on the semiconductor wafer is greater than a charge of the stocker contact 174 the second current controller permits charge flow from the wafer to the stocker contact 174. Charge dissipated from the semiconductor wafer may reduce adverse effects on the wafer during subsequent semiconductor fabrication processes performed on the wafer.

According to some embodiments, a semiconductor wafer processing system includes a stocker including an interior surface, a wafer carrier disposed within the stocker, a wafer shelf disposed within the wafer carrier for storing a semiconductor wafer, and a discharge circuit including a first conductor electrically coupled to the wafer shelf and a first current controller electrically coupled to the first conductor and to the interior surface of the stocker.

According to some embodiments, a semiconductor wafer processing system includes a wafer carrier for storing a semiconductor wafer, a conductor electrically coupled to the wafer carrier, a current controller electrically coupled to the conductor, and a wafer carrier transport tool electrically coupled to the current controller.

According to some embodiments, a method includes detecting whether a first charge at a conductor electrically coupled to a wafer shelf of a wafer carrier is greater than a second charge at a stocker contact of a discharge circuit and closing a conductive path from the conductor to the stocker contact if the first charge is greater than the second charge.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as CVD, for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally to be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method, comprising:
   detecting whether a first charge at a conductor electrically coupled to a wafer shelf of a wafer carrier is greater than a second charge at a stocker contact of a discharge circuit;
   closing a first conductive path from the conductor to the stocker contact when the first charge is greater than the second charge;
   determining whether a third charge at a wafer carrier transport tool is less than a fourth charge at the conductor; and
   closing a second conductive path from the conductor to the wafer carrier transport tool when the third charge is less than the fourth charge.

2. The method of claim 1, comprising opening the first conductive path when the first charge is less than the second charge.

3. The method of claim 1, comprising opening the second conductive path when the third charge is greater than the fourth charge.

4. The method of claim 1, comprising activating a wireless charging plate when the wireless charging plate is in contact with the wafer carrier.

5. The method of claim 4, wherein:
   detecting whether the first charge is greater than the second charge comprises detecting whether the first charge is greater than the second charge using a sensor-controlled circuit module, and
   activating the wireless charging plate comprises activating the wireless charging plate to charge the sensor-controlled circuit module.

6. The method of claim 1, comprising transporting the wafer carrier to a compartment of a wafer stocker and bringing the stocker contact, disposed within the wafer carrier, into electrical contact with a second conductor disposed in the compartment.

7. The method of claim 6, wherein detecting whether the first charge is greater than the second charge comprises detecting whether the first charge is greater than the second charge after bringing the stocker contact into electrical contact with the second conductor.

8. The method of claim 1, comprising gripping a wafer carrier handle of the wafer carrier using the wafer carrier transport tool.

9. The method of claim 8, wherein gripping the wafer carrier handle using the wafer carrier transport tool comprises electrically coupling a first conductive surface of the wafer carrier with a second conductive surface of the wafer carrier transport tool.

10. The method of claim 9, wherein determining whether the third charge is less than the fourth charge comprises determining whether the third charge is less than the fourth charge via a first current controller comprising the first conductive surface.

11. The method of claim 1, wherein:
    detecting whether the first charge is greater than the second charge comprises detecting whether the first charge is greater than the second charge via a first current controller, and
    determining whether the third charge is less than the fourth charge comprises determining whether the third charge is less than the fourth charge via a second current controller disposed at an opposite side of the wafer carrier relative to the first current controller.

12. A method, comprising:
    disposing a first wafer on a first wafer shelf of a wafer carrier, the first wafer shelf comprising a first conductor configured to be electrically coupled to the first wafer when the first wafer is on the first wafer shelf;
    disposing a second wafer on a second wafer shelf of the wafer carrier, the second wafer shelf comprising a second conductor configured to be electrically coupled to the second wafer when the second wafer is on the second wafer shelf;
    detecting whether a first charge at a first terminal of a first current controller is greater than a second charge at a second terminal of the first current controller, wherein the first terminal is electrically coupled to the first conductor and the second conductor via a third conductor;
    closing a first conductive path between the first terminal and the second terminal when the first charge is greater than the second charge; and
    opening the first conductive path when the first charge is less than the second charge.

13. The method of claim 12, comprising gripping a wafer carrier handle of the wafer carrier using a wafer carrier transport tool.

14. The method of claim 13, wherein detecting whether the first charge is greater than the second charge comprises detecting whether the first charge is greater than the second charge after gripping the wafer carrier handle using the wafer carrier transport tool.

15. The method of claim 13, wherein gripping the wafer carrier handle using the wafer carrier transport tool comprises electrically coupling a first conductive surface of the wafer carrier with a second conductive surface of the wafer carrier transport tool through which the second charge is received.

16. The method of claim 12, comprising placing the wafer carrier in a compartment of a wafer stocker, wherein detecting whether the first charge is greater than the second charge comprises detecting whether the first charge is greater than the second charge after placing the wafer carrier in the compartment.

17. A method, comprising:
placing a wafer carrier in a wafer stocker such that a wireless charging plate of the wafer stocker contacts the wafer carrier and a first conductor of the wafer stocker contacts a stocker contact of the wafer carrier;
activating the wireless charging plate of the wafer stocker when the wireless charging plate is in contact with the wafer carrier, wherein the wireless charging plate is configured to charge a sensor-controlled circuit module of the wafer carrier;
detecting, by the sensor-controlled circuit module, whether a first charge at a first terminal of the sensor-controlled circuit module electrically coupled to a wafer shelf of the wafer carrier is greater than a second charge at a second terminal of the sensor-controlled circuit module electrically coupled to the stocker contact; and
closing, by the sensor-controlled circuit module, a first conductive path from the first terminal to the second terminal when the first charge is greater than the second charge.

18. The method of claim 17, comprising opening the first conductive path when the first charge is less than the second charge.

19. The method of claim 17, wherein placing the wafer carrier in the wafer stocker comprises gripping a wafer carrier handle of the wafer carrier using a wafer carrier transport tool.

20. The method of claim 19, comprising:
determining whether a third charge at the wafer carrier transport tool is less than a fourth charge at a second conductor electrically coupled to the wafer shelf; and
closing a second conductive path from the second conductor to the wafer carrier transport tool when the third charge is less than the fourth charge.

\* \* \* \* \*